United States Patent [19]

Liu et al.

[11] Patent Number: 5,906,948
[45] Date of Patent: May 25, 1999

[54] METHOD FOR ETCHING HIGH ASPECT-RATIO MULTILEVEL CONTACTS

[75] Inventors: Hao-Chieh Liu, Taipei; Erik S. Jeng, Hsinchu, both of Taiwan

[73] Assignee: Vanguard International Semiconductor Corporation, Hsinchu, Taiwan

[21] Appl. No.: 09/062,358

[22] Filed: Apr. 17, 1998

[51] Int. Cl.$^6$ .................... H01L 21/3065; H01L 21/311
[52] U.S. Cl. .................. 438/689; 438/734; 438/712; 216/70; 216/76
[58] Field of Search ................... 438/734, 712; 216/70, 76

[56] References Cited

U.S. PATENT DOCUMENTS 5,269,879  12/1993  Rhoades et al. ..................... 438/712
5,399,237   3/1995  Keswick et al. ..................... 216/76
5,476,816  12/1995  Mautz et al. ....................... 438/712

Primary Examiner—Benjamin Utech
Assistant Examiner—Lynette T. Umez-Eronini
Attorney, Agent, or Firm—Christensen O'Connor Johnson & Kindness PLLC

[57] ABSTRACT

A method for etching dielectric layers is disclosed. A first etch of the dielectric layers is performed with a gas chemistry comprising $C_4F_8$ flowing at about 10 sccm to about 25 sccm and $CH_3F$ flowing at about 5 sccm to about 20 sccm. A second etch of the dielectric layers is performed with the gas chemistry and flow rates of gases which are about 10% to about 40% greater than the flow rates of gases in the first etch.

15 Claims, 3 Drawing Sheets

METHOD FOR ETCHING HIGH ASPECT-RATIO MULTILEVEL CONTACTS

FIELD OF THE INVENTION

The present invention relates to semiconductor fabrication processes, and more specifically, to a method for etching contact holes for high aspect-ratio multilevel contacts.

BACKGROUND OF THE INVENTION

The trend in integrated circuits (IC) is to form smaller chips that perform sophisticated functions with high speed. This leads to improvements in computer, communication, and consumer electronics equipment. The devices in the ICs are shrunk down to the deep submicron range in ultra large scale integration (ULSI) technology. Accordingly, the number of devices on a single chip has been increased from a thousand to nearly a billion.

However, the accuracy, controllability, and yield of the semiconductor fabricating process is limited. It has been found that conventional processes like lithography and etching are greatly challenged in the manufacture of submicron or smaller feature size devices. The process becomes harder to control and the yield of the products is reduced.

Metallization is the process for forming contacts and interconnections on a semiconductor substrate. The metallization process plays a vital role in forming defect-free connections to ensure the functionality of the circuits. Problems like open connections, undesired shorts, misalignment, leakage, and high resistance contacts are found to cause serious failures in operation of the circuits.

Referring to FIG. 1, a semiconductor substrate 10 having a gate structure 12, and conductive layers 14 and 16 are illustrated. Typically, the gate structure 12 includes a polysilicon layer 12a, a tungsten silicide layer 12b, and a nitride layer 12c. The conductive layers 14 and 16 can be multilevel polysilicon or conductive structures which are generally referred to as poly-2 (the second polysilicon layer) and poly-4 (the fourth polysilicon), respectively. The conductive layer 14 includes a polysilicon layer 14a, a tungsten silicide layer 14b, and a nitride layer 14c. A dielectric layer or oxide layer 18 is used for insulating between devices and connections.

In the metallization process, the dielectric layer 18 is etched to form contact holes to the conducting structures of layers 14, 16, and gate 12. A photoresist layer 20 is formed over the dielectric layer for defining the contact hole openings.

It has been found that the etching process is difficult to control for forming contact holes with different depths and aspect-ratios in the multilevel structures. The etching of contact holes must be stopped at the polysilicon layer 16, the tungsten silicide layer 14b, the tungsten silicide layer 12b, and the substrate 10, respectively. In manufacturing sub-micrometer devices, the depth of the dielectric layer 18 may be upwards of 2 micrometers and the aspect-ratio can easily be more than 5.

FIG. 2 shows the structure of FIG. 1 after a conventional etching process. As seen, it is not unusual for the polysilicon layer 16 to be broken. Further, the etching is stopped on the nitride layers 12c and 14c. This is caused by the polymer regrowth on the nitride which stops the etching process. Finally, the high aspect ratio contact hole to the substrate 10 is difficult to form and the etching is stopped before reaching the substrate 10. Polymer accumulation in the deep hole is thought to be the cause. If the etching process is made stronger to etch the contact hole down to the substrate 10, the "substrate loss" problem may occur and the junction region can be damaged as indicated with the dashed line.

What is needed is a method for solving the over-etching and under-etching problems in forming multilevel contacts.

SUMMARY OF THE INVENTION

A method for etching dielectric layers is disclosed. The method comprises the steps of: performing a first etch of said dielectric layers with a gas chemistry comprising $C_4F_8$ flowing at about 10 sccm to about 25 sccm and $CH_3F$ flowing at about 5 sccm to about 20 sccm; and performing a second etch of said dielectric layers with said gas chemistry and flow rates of gases which are about 10% to about 40% greater than the flow rates of gases in said first step etching.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention discloses a method for etching dielectric layers to form contact holes. A two-step etching process is disclosed. The present invention is illustrated in the example of forming high aspect-ratio and multilevel contact structures is illustrated as a preferred embodiment.

Without limiting the scope and the spirit of the present invention, a detailed embodiment of applying the etching method of the present invention to form contact structures is described in detail. Upon acknowledging the disclosed method, a person skilled in the art can apply the method of the present invention to various etching processes. The variations in the application of the etching process are well known in the art and thus are not illustrated in detail.

Figure 1:
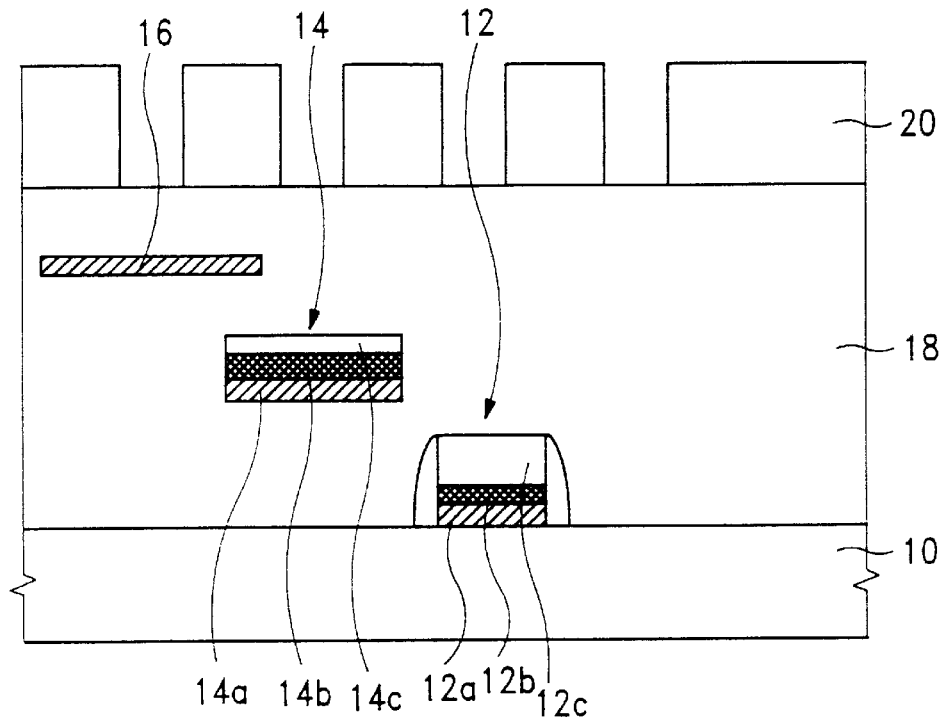
FIG. 1 illustrates a prior art cross sectional view of a semiconductor substrate with multilevel structures.
Figure 2:
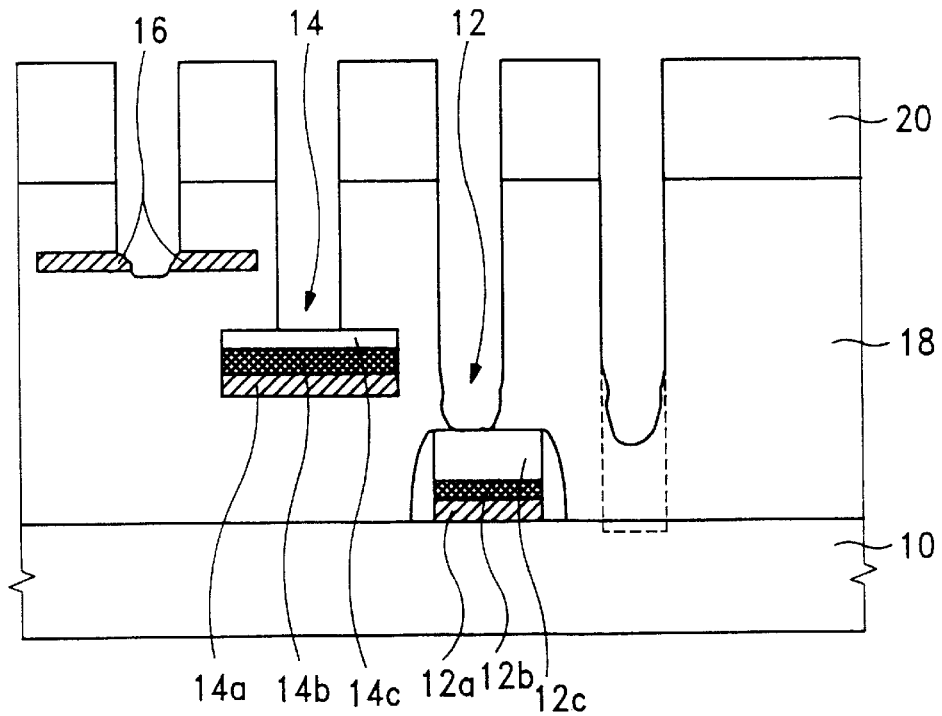
FIG. 2 illustrates a cross sectional view of the semiconductor substrate after etching contact holes using a conventional method.
Figure 3:
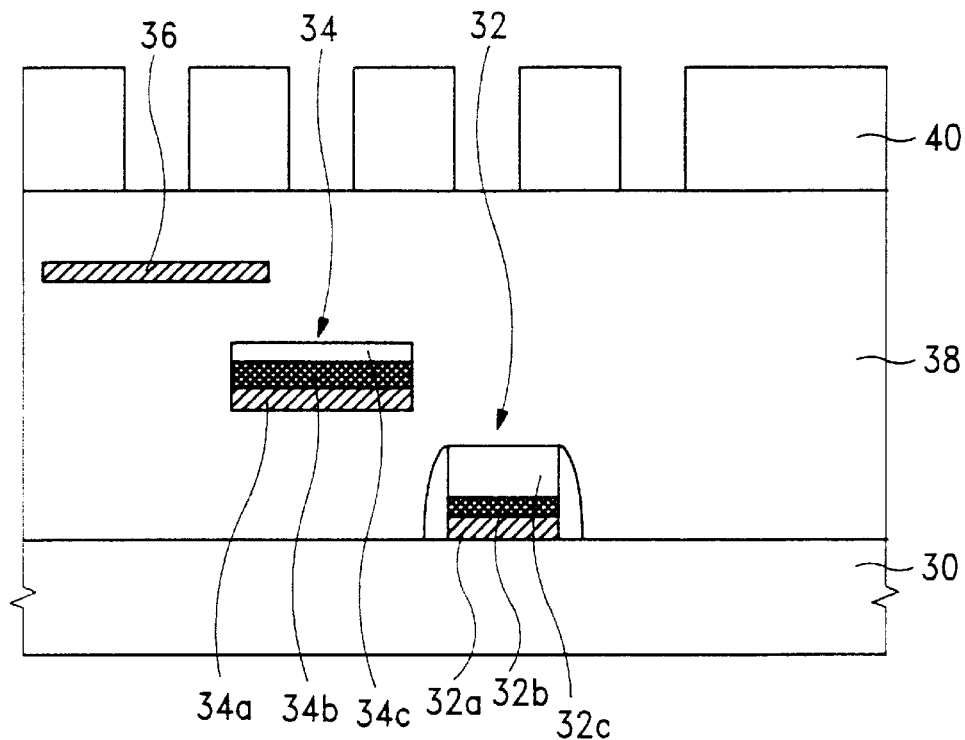
FIG. 3 illustrates a cross sectional view of a semiconductor substrate with multilevel structures in accordance with the present invention.

Turning to FIG. 3, a semiconductor substrate 30 having a gate structure 32, and conductive layers 34 and 36 are illustrated. In general, a silicon substrate with a crystalline direction of <100> is used as the substrate 30. Other kinds of substrate with different crystalline directions and materials can also be used. Typically, the gate structure 32 includes a polysilicon layer 32a, a tungsten silicide layer 32b, and a nitride layer 32c. The conductive layers 34 and 36 are multilevel polysilicon structures which are generally referred to respectively as poly-2 (the second polysilicon layer) and poly-4 (the fourth polysilicon layer).

The conductive structure 34 includes a polysilicon layer 34a, a tungsten silicide layer 34b, and a nitride layer 34c. Alternatively, oxynitride layers can also be used to replace the nitride layers. Another dielectric layer 38 is deposited over the substrate 30 and the multiple structures for insulating between devices and the connections formed within. As an example, the dielectric layer 38 can be an oxide layer, like a BPSG (borophosphosilicate) layer.

In the metallization process, the dielectric layers 32c, 34c, and 38 are etched to form contact holes to individual structures. A photoresist layer 40 is formed over the dielectric layer 38 to define the contact hole openings.

Figure 4:
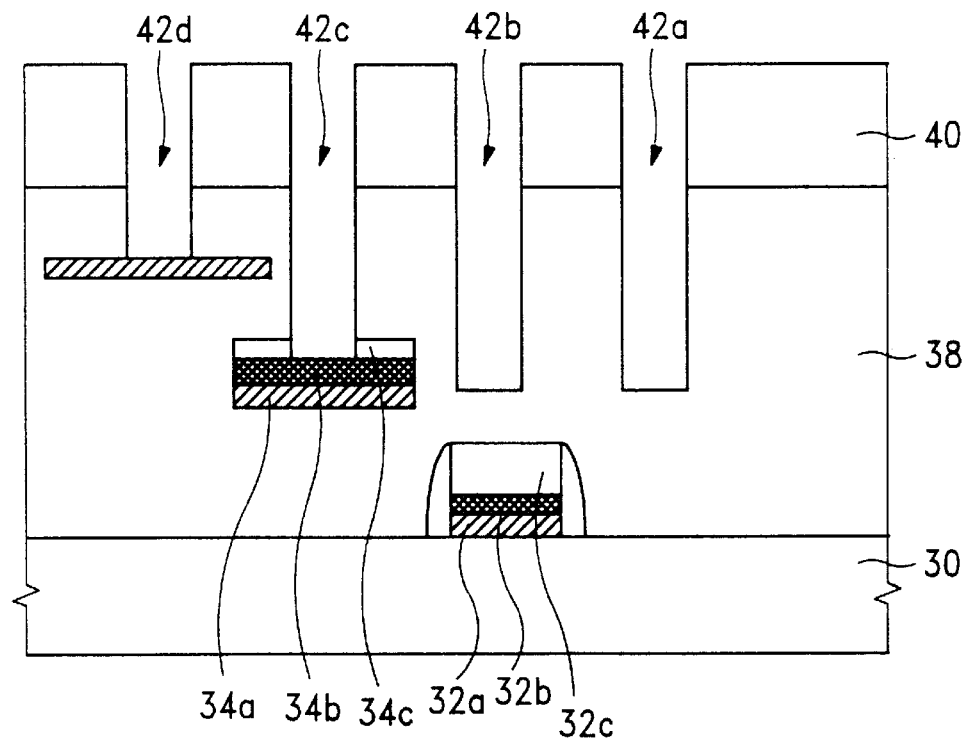
FIG. 4 illustrates a cross sectional view of the semiconductor substrate after a first step etching in accordance with the present invention.

After the photoresist layer 40 is formed and developed, a first etch is performed to etch the dielectric layers, as shown in FIG. 4. The first etch process is an anisotropic etching process. A RIE (reactive ion etching) is employed preferably. MERIE (magnetically enhanced reactive ion etching) or ICP (inductively coupled plasma) mode etcher can also be used alternatively for having enhanced etching effect.

A gas chemistry of two major reactants of $C_4F_8$ and $CH_3F$ is used. In the preferred embodiment, $C_4F_8$ is supplied with a flow rate between about 10 sccm to about 25 sccm and $CH_3F$ is supplied with a flow rate between about 5 sccm to about 20 sccm. The first etch in the present invention has a high selectivity to the photoresist layer 40 when etching the oxide layer 38. Thus, the photoresist layer 40 can be preserved from etching and contact holes 42a, 42b, 42c, and 42d can be defined accurately with the openings defined in the photoresist layer 40.

In addition to the two major reactants, other reactants can be added. $C_2F_6$ is added with a flow rate between about 0.1 sccm to about 10 sccm. Ar (argon) is added as a carrier gas or a dilute gas which is flowing at about 60 sccm to about 150 sccm. Additionally, CO (carbon monoxide) and $O_2$ (oxygen) are supplied to reduce the formation and the deposition of the polymer on the reaction chamber and the chamber condition is stabilized. In the preferred embodiment, CO is flowed at about 0.1 to about 10 sccm and $O_2$ is flowed at about 2 to about 10 sccm.

The total gas flow rate of the first step etching is about 100 sccm to about 150 sccm. The first etch by RIE is performed at a pressure between about 4 millitorr to about 8 millitorr and a power between about 1,000 watts to about 1,500 watts.

Referring to FIG. 4, the first etch is performed to etch approximately one-half of the dielectric layer 38. As an example, the contact holes 42a to the substrate 10 is etched to about 40% to 70% of the total depth of the dielectric layer 38. A maximum etching depth of about 1.8 micrometer is found in the case.

Next, a second etch is performed. With the disclosed reactants and settings, both etching steps can eliminate etch-stop on nitride and still provide high selectivity to underlying conductive layers like the silicon substrate 10, tungsten silicides 32b and 34b, and polysilicon 36. As indicated in FIG. 4, the contact hole 42b over the gate structure 32 extends to about the same depth with the contact hole 42a. The contact hole 42c extends down to the tungsten silicide layer 34b. The contact hole 42d extends down to the polysilicon layer 36 without polysilicon loss. This is due to the high etching selectivity to the polysilicon of the above described first etching process.

Figure 5:
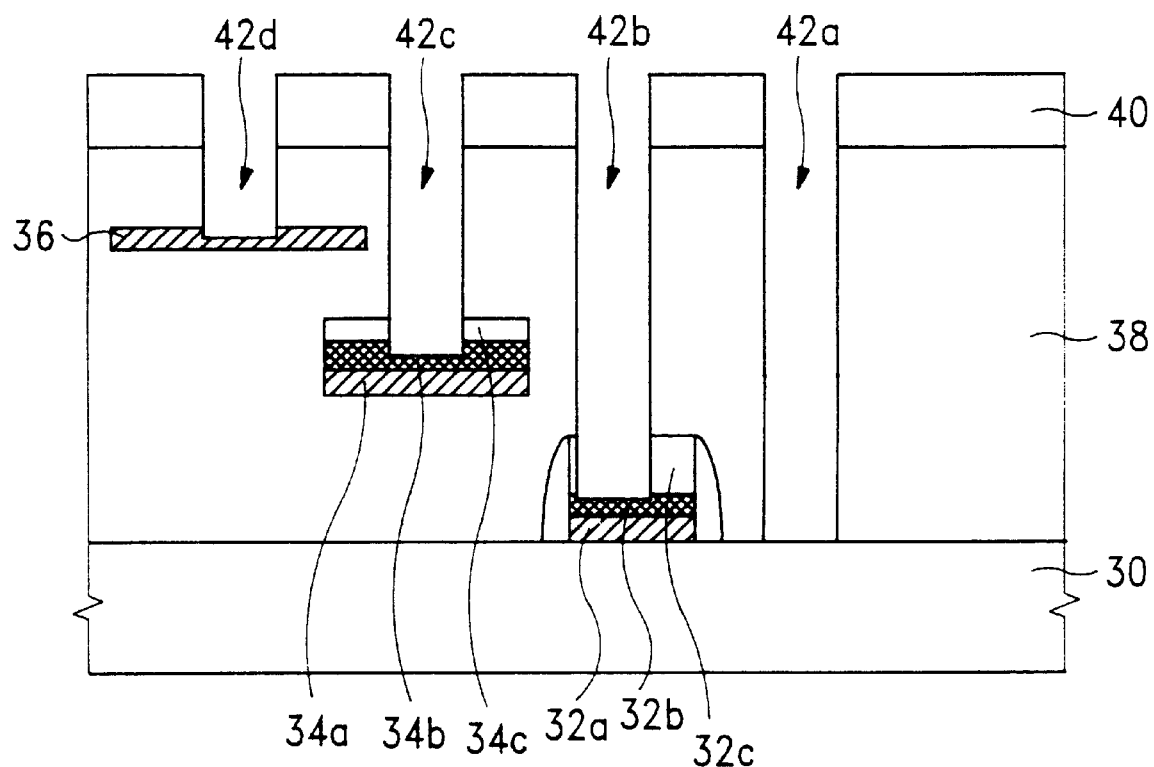
FIG. 5 illustrates a cross sectional view of the semiconductor substrate after a second step etching in accordance with the present invention.

Turning to FIG. 5, the second etch results in the structure as shown where the dielectric layers 32c, 34c, and 38 etched. The second step etching is performed with similar gas chemistry to the first step etching. However, the flow rates of gases in the second step etching are about 10% to about 40% greater than the flow rates of the first etch. Thus, the etching effect is strengthened and the contact holes are etched deeper. The contact hole 42a to the substrate 30 is formed without substrate loss due to the high selectivity of the etching chemistry between oxide and silicon. An etching depth of about 2.8 micrometer can be achieved with the second etching step.

The nitride layers 32c and 34c can be removed effectively and the contact holes 42b and 42c are extended respectively down to the tungsten silicide gate 32b and tungsten silicide layer 34b. The contact hole 42d is formed with reduced loss of the polysilicon layer 36 and the risk of breaking the polysilicon layer 36 in the conventional etching process is eliminated. One effect of the second etch is that the photoresist layer 40 is partially etched.

The total gas flow rate of the second etch is increased to about 150 sccm to about 200 sccm. The second etch by RIE is performed at similar pressure and power settings. The pressure is between about 6 millitorr to about 10 millitorr, which can be raised a little than the previous step. The power is between about 1,000 watts to about 1,500 watts.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for etching dielectric layers, said method comprising the steps of:

performing a first etch of said dielectric layers with a gas chemistry comprising $C_4F_8$ flowing at about 10 sccm to about 25 sccm, $CH_3F$ flowing at about 5 sccm to about 20 sccm, CO flowing at about 0.1 sccm to about 10 sccm, and $O_2$ flowing at about 2 sccm to about 10 sccm; and performing a second etch of said dielectric layers with said gas chemistry and flow rates of gases which are about 10% to about 40% greater than flow rates of gases in said first etch.

2. The method of claim 1, wherein said first etch and said second etch are performed at a pressure between about 4 millitorr to about 10 millitorr.

3. The method of claim 1, wherein said first etch and said second etch are performed to form contact holes to multi-level contacts in said dielectric layers.

4. The method of claim 1, wherein said first etch and said second etch are RIE.

5. The method of claim 1, wherein said first step etch and said second step etch are MERIE or ICP mode etching.

6. The method of claim 1, wherein said first etch and said second etch are performed with a power between about 1,000 watts to about 1,500 watts.

7. The method of claim 1, wherein said gas chemistry further comprises $C_2F_6$ flowing at about 0.1 sccm to about 10 sccm.

8. The method of claim 1, wherein said gas chemistry further comprises Ar flowing at about 60 sccm to about 150 sccm.

9. A method for etching dielectric layers, said method comprising the steps of:

performing a first etch of said dielectric layers with a gas chemistry comprising $C_4F_8$ flowing at about 10 sccm to about 25 sccm, $CH_3F$ flowing at about 5 sccm to about 20 sccm, Ar flowing at about 60 sccm to about 150 sccm, CO flowing at about 0.1 sccm to about 10 sccm, and $O_2$ flowing at about 2 sccm to about 10 sccm; and performing a second etch of said dielectric layers with said gas chemistry and flow rates of gases which are about 10% to about 40% greater than the flow rates of gases in said first etch.

10. The method of claim 9, wherein said first etch and said second etch are performed at a pressure between about 4 millitorr to about 10 millitorr.

11. The method of claim 9, wherein said first etch and said second etch are performed to form contact holes to multi-level contacts in said dielectric layers.

12. The method of claim 9, wherein said first etch and said second etch are RIE.

13. The method of claim 9, wherein said first etch and said second etch are MERIE or ICP mode etching.

14. The method of claim 9, wherein said first etch and said second etch are performed with a power between about 1,000 watts to about 1,500 watts.

15. The method of claim 9, wherein said gas chemistry further comprises $C_2F_6$ flowing at about 0.1 sccm to about 10 sccm.

* * * * *